(12) United States Patent
Lee et al.

(10) Patent No.: US 7,561,410 B1
(45) Date of Patent: Jul. 14, 2009

(54) HYBRID CAPACITOR

(75) Inventors: Min-Lin Lee, Hsinchu (TW); Li-Duan Tsai, Hsinchu (TW); Shur-Fen Liu, Hsinchu County (TW); Bang-Hao Wu, Kaohsiung (TW); Cheng-Liang Cheng, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 12/050,188

(22) Filed: Mar. 18, 2008

(30) Foreign Application Priority Data

Dec. 21, 2007 (TW) .............................. 96149241 A

(51) Int. Cl.
*H01G 9/025* (2006.01)
(52) U.S. Cl. .................. 361/525; 361/523; 361/528; 361/529; 361/540
(58) Field of Classification Search ............. 361/525, 361/516–519, 303–305, 523, 528–529, 540–541; 29/25.01, 25.03
See application file for complete search history.

(56) References Cited

U.S. PATENT DOCUMENTS

| | | | |
|---|---|---|---|
| 5,811,868 A | 9/1998 | Bertin et al. | |
| 6,446,317 B1 | 9/2002 | Figueroa et al. | |
| 6,510,045 B2* | 1/2003 | Mido et al. | 361/529 |
| 6,545,353 B2* | 4/2003 | Mashino | 257/724 |
| 6,775,150 B1* | 8/2004 | Chakravorty et al. | 361/761 |
| 6,791,133 B2 | 9/2004 | Farooq et al. | |
| 6,870,728 B1* | 3/2005 | Burket et al. | 361/538 |
| 6,920,051 B2* | 7/2005 | Figueroa et al. | 361/763 |
| 6,989,982 B2* | 1/2006 | Kobayashi et al. | 361/523 |
| 7,031,141 B2* | 4/2006 | Kuriyama | 361/528 |
| 7,230,818 B2* | 6/2007 | Noguchi et al. | 361/528 |
| 7,317,610 B2* | 1/2008 | Nakamura et al. | 361/540 |

* cited by examiner

*Primary Examiner*—Nguyen T Ha
(74) *Attorney, Agent, or Firm*—Jianq Chyun IP Office

(57) ABSTRACT

A hybrid capacitor is provided which includes a substrate, at least one plate capacitor and at least one through hole capacitor. The substrate has through holes and the plate capacitors are on the substrate. At least one through hole capacitor and at least one plate capacitor are in parallel. The through hole capacitor at least includes an anode layer, a first dielectric layer, a first cathode layer and a second cathode layer. The anode layer is disposed on an inner surface of at least one through hole, and a surface of the anode layer is a porous structure. The first dielectric layer is disposed on the porous structure of the anode layer and covered with the first cathode layer. The first cathode layer is covered with the second cathode layer. A conductivity of the second cathode layer is larger than a conductivity of the first cathode layer.

28 Claims, 9 Drawing Sheets

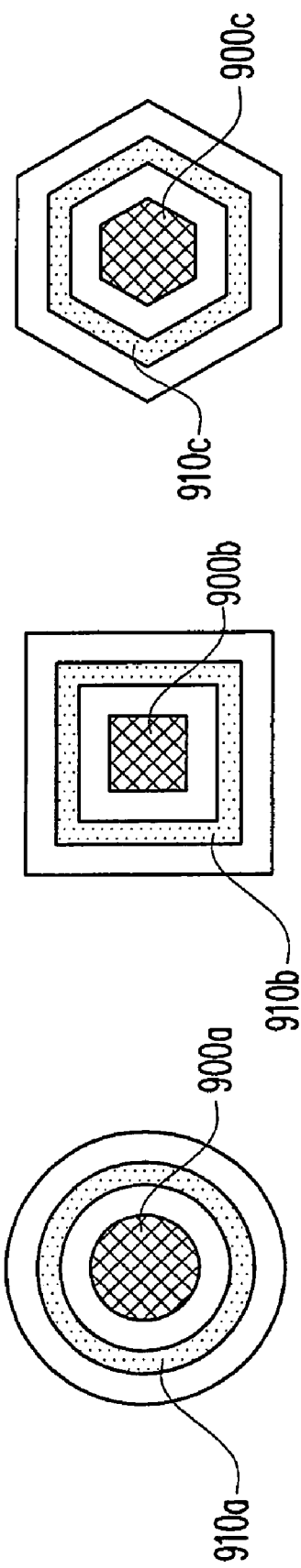

HYBRID CAPACITOR

CROSS-REFERENCE TO RELATED APPLICATION

This application claims the priority benefit of Taiwan application serial no. 96149241, filed on Dec. 21, 2007. The entirety the above-mentioned patent application is hereby incorporated by reference herein and made a part of specification.

BACKGROUND OF THE INVENTION

1. Field of the Invention

The present invention is related to a hybrid capacitor capable of stabilizing a voltage and reducing noise on a high frequency and a method of fabricating the same.

2. Description of Related Art

In order to meet the demand for multiple functions in electronic products, the latest trend in the system in package (SiP) technology tends to package integrated circuits (IC) having different functions into one multi-functional IC module in a three-dimensional stacking mode. When different ICs are integrated by three-dimensional stacking, in order to solve the problem of mismatch between the upper and lower layers of IC pins, an interposer is added for redistribution of upper and lower chip signals so as to coordinate the upper and lower layers of ICs. As a number of stacked layers increases, arranging SMD capacitors on a circuit board is not sufficient to fulfill the requirement of stabilizing a common voltage when a plurality of layers of chips are stacked together.

Furthermore, as the working frequency of ICs increases, if high frequency noise is removed only by a decoupling capacitor on the circuit board, since a transmission path is too long because of stacking multiple layers of ICs, parasitic inductance are therefore increased and high frequency noise would be difficult to remove.

SUMMARY OF THE INVENTION

The present invention is directed to a hybrid capacitor capable of providing large capacitance so as to stabilize voltage between chips and remove high-frequency interference.

The present invention is directed to a hybrid capacitor including a substrate, at least one plate capacitor and at least one through hole capacitor. The substrate has a plurality of through holes, and the plate capacitor is disposed on the substrate. The through hole capacitor is disposed in at least one through hole and connected in parallel with the plate capacitor. The through hole capacitor itself may be wholly or partially connected in parallel. This type of through hole capacitor at least includes an anode layer, a first dielectric layer, a first cathode layer and a second cathode layer. The anode layer is at least disposed on an inner surface of the through hole, and at least the anode layer on the inner surface of the through hole is a porous structure. The first dielectric layer is at least disposed on the porous structure of the anode layer. The first dielectric layer is covered with the first cathode layer, and the first cathode layer is covered with the second cathode layer. A conductivity of the second cathode layer is larger than a conductivity of the first cathode layer.

In the present invention, the through hole capacitor having the anode layer with the porous structure is connected in parallel with the plate capacitor, and thus a hybrid capacitor having large capacitance is obtained. Moreover, the hybrid capacitor of the present invention capable of fulfilling the requirements is designed through coordinating the through hole capacitors having the anode layer with the porous structure and the plate capacitors. Hence, the hybrid capacitor of the present invention provides a capacitance larger than 0.1 μF within the size of a chip to stabilize voltage among chips and simultaneously remove high-frequency interference of 1-4 GHz.

In order to make the aforementioned and other objects, features and advantages of the present invention more comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 9A through 9C are three transformed examples of a hybrid capacitor according to the third embodiment of the present invention.

DESCRIPTION OF EMBODIMENTS

Figure 1:
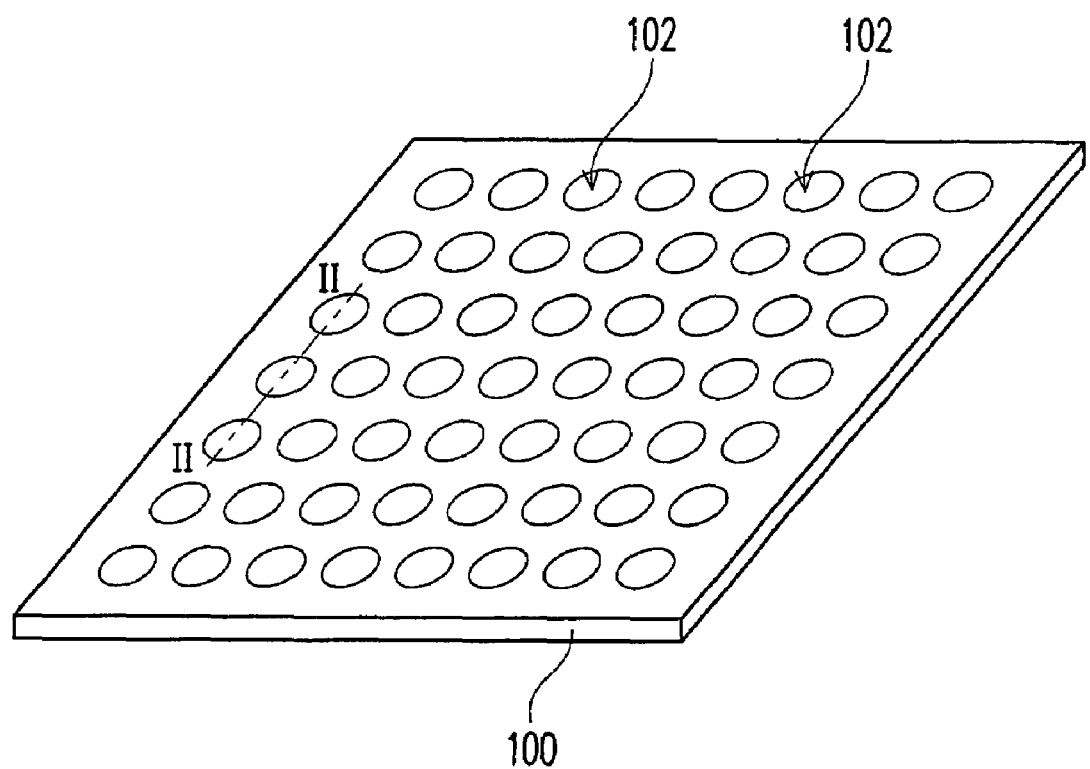
FIG. 1 is a three-dimensional view of a substrate of a hybrid capacitor according to the first embodiment of the present invention.

Please refer to the accompanying drawings while reading the following description for a comprehensive understanding of the present invention. The drawings illustrate a plurality of embodiments of the present invention. Nevertheless, the present invention may also be embodied in many different forms and should not be construed as limited to the embodiments set forth hereinafter. In reality, the embodiments are provided to render disclosure of the present invention more explicit and complete and thereby fully convey the scope of the present invention to people ordinarily skilled in the art. For the purpose of clarity, the sizes and relative sizes of each of the layers in the drawings may be illustrated in exaggerated proportions.

Figure 2:
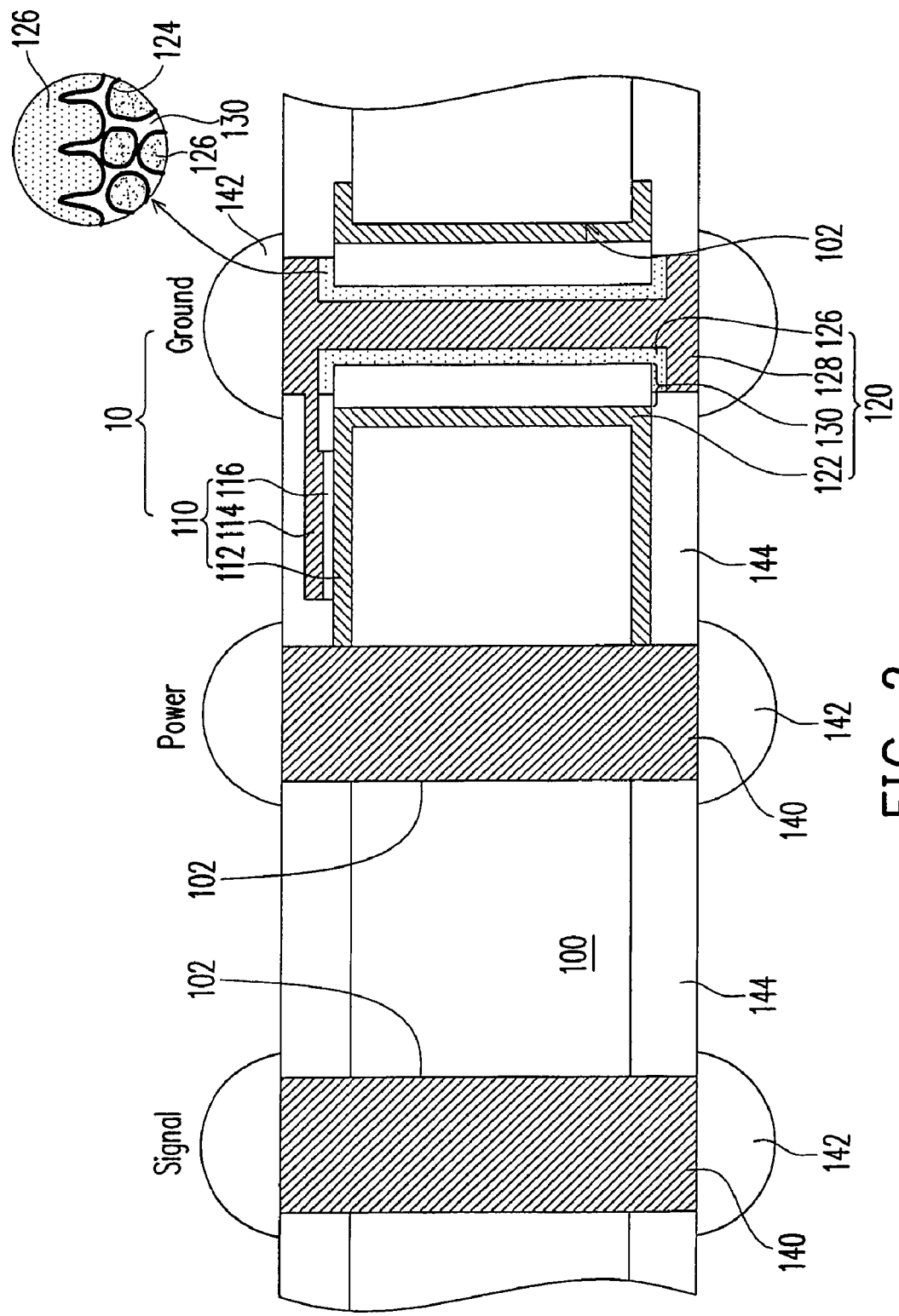
FIG. 2 is a schematic cross-sectional view along line II-II of FIG. 1.

FIG. 1 is a substrate having a hybrid capacitor or a silicon interposer according to the first embodiment of the present invention. FIG. 2 is a schematic cross-sectional view along line II-II of FIG. 1.

Referring to FIGS. 1 and 2, a hybrid capacitor 10 of the first embodiment includes a substrate 100, at least one plate capacitor 110 and at least one through hole capacitor 120. The substrate 100 has a plurality of through holes 102 and the plate capacitor 110 is disposed on the substrate 100. The through hole capacitors 120 are disposed in at least one through hole 102 and connected in parallel with the plate capacitor 110. The through hole capacitor 120 at least includes an anode layer 122, a first dielectric layer 124, a first cathode layer 126 and a second cathode layer 128. According to the first embodiment of the present invention, the substrate 100 is a silicon substrate. The substrate 100 may also be an organic substrate, a metal substrate or an insulating substrate. The through holes 102 in the substrate 100 may be arranged in an array. Further, besides disposing the through hole capacitor 120 therein, the through holes 102 may also serve as a portion of a circuit line 140, such as connecting a power output terminal and a signal terminal through a bump 142, and the through hole capacitor 120 is a ground terminal. In addition, although the first embodiment demonstrates a circular through hole capacitor 120, the present invention should not be construed as limited to the specific shape described in the first embodiment and may also include other feasible shapes, such as a hexagonal, a circular, a square or a ring-shaped through hole capacitor.

Still referring to FIG. 2, the anode layer 122 is at least disposed on an inner surface of the through hole 102. A material of the anode layer 122 is, for example, aluminum (Al), tantalum (Ta), niobium (Nb) or niobium oxide (NbO). Moreover, the anode layer 122 at least on the inner surface of the through hole 102 is a porous structure 130, as illustrated in a locally enlarged view on the upper right corner of FIG. 2. The first dielectric layer 124 is disposed on the porous structure 130 of the anode layer 122. For example, when the anode layer 122 is an aluminum layer and the porous structure 130 is a structure obtained after aluminum is etched, the first dielectric layer 124 is $Al_2O_3$ formed on a surface of the porous structure 130 after the porous structure 130 undergoes anodic oxidation. The porous structure 130 may also be called as a "sponge-shaped structure". The first dielectric layer 124 is covered with the first cathode layer 126. A material of the first cathode layer 126 is, for example, an organic semiconductor, an inorganic semiconductor or an organic-inorganic hybrid conductive material. The inorganic semiconductor is like manganese dioxide ($MnO_2$), and the organic semiconductor is like a charge transfer complex or a conductive polymer. The conductive polymer is, for example, polypyrrole, polythiophene, polyaniline or other suitable conductive polymers. A single conductive polymer material or two mixed conductive polymers may be selected as a material of the first cathode layer 126. Additionally, the first cathode layer 126 may also be a multilayer structure, and not limited to the single-layered structure described in the first embodiment of the present invention.

Referring again to FIG. 2, since the material of the first cathode layer 126 has a self-healing ability, when in a high leakage current region, the material becomes locally insulation so that leakage current of elements in the capacitor is reduced. The second cathode layer 128 fills up the through holes 102 so as to cover a surface of the first cathode layer 126. A conductivity of the second cathode layer 128 is larger than a conductivity of the first cathode layer 126. The second cathode layer 128 includes a carbon- and metal-containing composite layer. The metal in the composite layer includes silver (Ag), copper (Cu), gold (Au) or nickel (Ni). In other words, a material of the second cathode layer 128 may be C/Ag, or C/Cu or C/Au. The second cathode layer 128 may also be a pure metal layer. The second cathode layer 128 includes filling up the through holes 102.

Still referring to FIG. 2, the plate capacitor 110 at least includes a first conductive layer 112, a second conductive layer 114 disposed thereon and a second dielectric layer 116. The second dielectric layer 116 is disposed between the first conductive layer 112 and the second conductive layer 114. A capacitance of the plate capacitor 110 is below 0.1 µF, for example. The plate capacitor 110 may be disposed on two sides of the substrate 100 besides on one side of the substrate 100 as illustrated in FIG. 2. A dielectric coefficient of the second dielectric layer 116 in the plate capacitor 110 is about 1-2000 and a thickness of the second dielectric layer is about 0.1 µm~10 µm, for example. In the first embodiment of the present invention, a material of the second dielectric layer 116 is selected from a group consisted of, for example, barium zirconate titanate (BZT); barium strontium titanate (BST); barium titanate; barium titanate containing at least one element of Pb, Nb, W, Ca, Mg and Zn; lead titanate; lead zirconate titanate (PZT); polycrystalline lanthanum-modified lead zirconate titanate (PLZT); lead niobate and deratives thereof; and lead tungstate and deratives thereof.

Furthermore, FIG. 2 illustrates as a cross-sectional view. The cross-sectional view only schematically illustrates in an idealistic manner, and therefore an actual implementation may have a shape different from that of FIG. 2 because of design requirements and/or tolerance. Hence, the present invention should not be construed as limited to the specific shape depicted in the first embodiment and may include other feasible shapes. For example, a shape of the plate capacitor 110 in FIG. 2 includes a plain shape, such as a hexagon, a circle or a square. Therefore, the cross-sectional view is schematic in essence, and the shape thereof does not represent an exact shape of an element and is not intended to limit the scope of the present invention. The first conductive layer 112 or the second conductive layer 114 may adopt a conductive material identical to that of the anode layer 122 or adopt the same conductive material as the second cathode layer 128. A surface of the substrate 100 is covered with an insulation layer 144.

Figure 3:
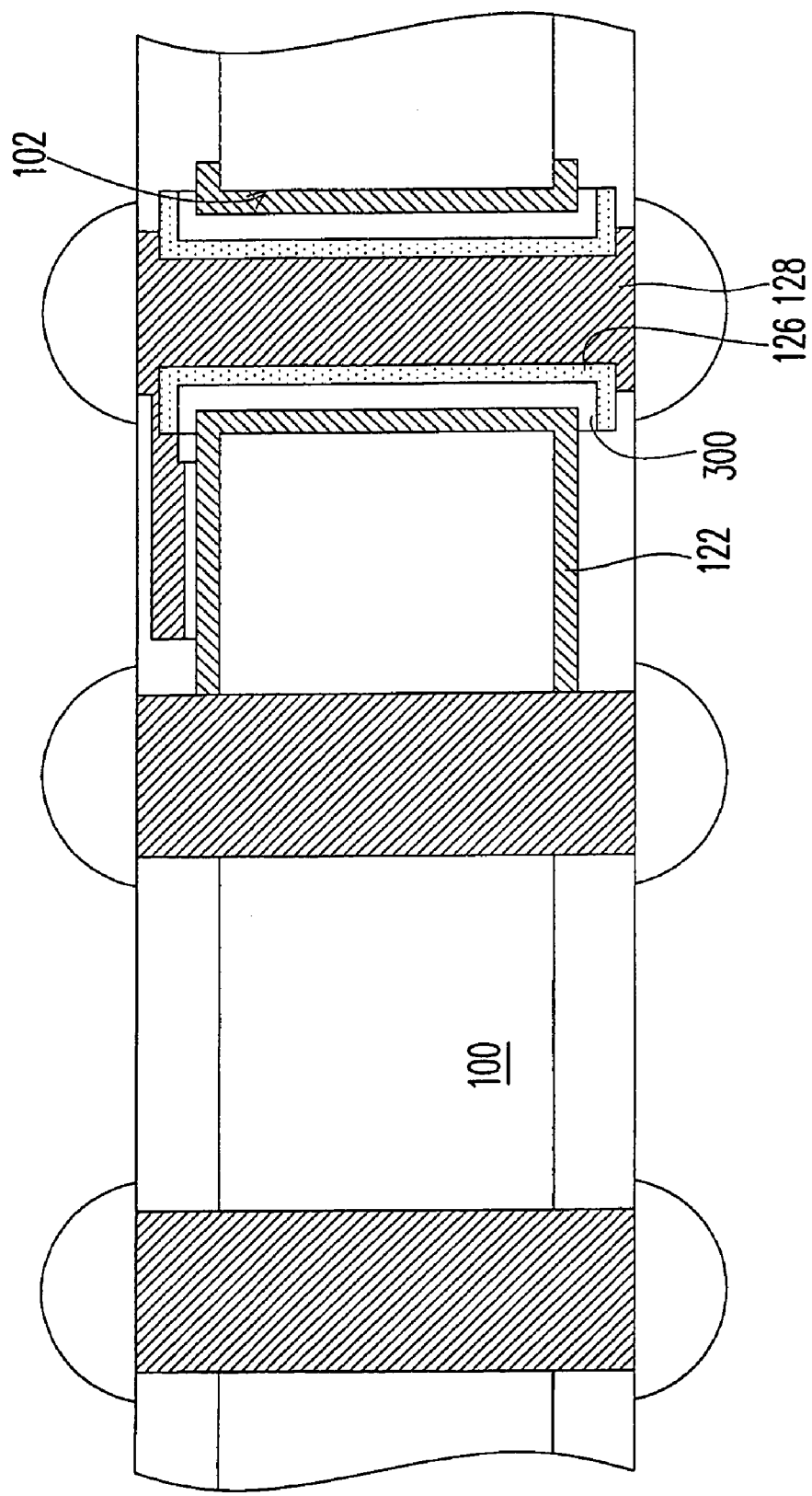
FIG. 3 is a schematic cross-sectional view of a hybrid capacitor according to a transformed example of FIG. 2.

FIG. 3 is a schematic cross-sectional view of a transformed example of the hybrid capacitor of FIG. 2. The same reference numerals are used in FIG. 3 as those in FIG. 2 to represent the same elements. Referring to FIG. 3, the most significant difference between FIG. 3 and FIG. 2 lies in that a porous structure 300 of the anode layer 122 extends to the surface of the substrate 100 out of the through holes 102. Alternatively speaking, the first dielectric layer (not illustrated) disposed on a surface of a porous structure 300 also extends to the surface of the substrate 100 out of the through holes 102. As a result, the capacitance of the through holes 102 grows larger.

Figure 4:
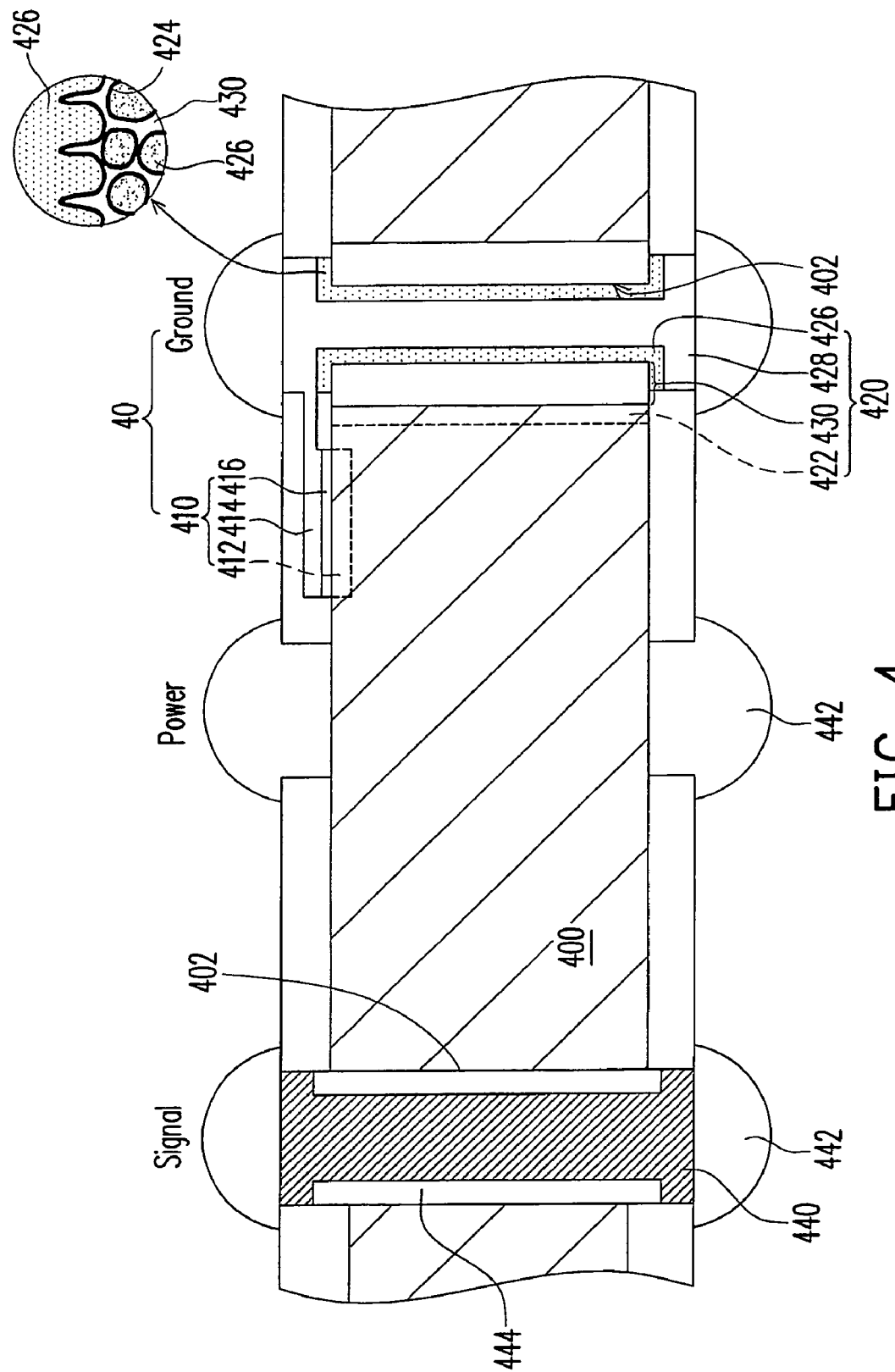
FIG. 4 is a schematic cross-sectional view of a hybrid capacitor according to the second embodiment of the present invention.

FIG. 4 is a schematic cross-sectional view of a hybrid capacitor according to the second embodiment of the present invention.

Referring to FIG. 4, a hybrid capacitor 40 of the second embodiment includes a metal substrate 400, at least one plate capacitor 410 and at least one through hole capacitor 420. The metal substrate 400 has a plurality of through holes 402. A portion of the metal substrate 400 can serve as a first conductive layer 412 of the plate capacitor 410. A second conductive layer 414 of the plate capacitor 410 is disposed on a surface of a second dielectric layer 416. The second dielectric layer 416 is disposed between the metal substrate 400 and the second conductive layer 414. For materials which may be selected to fabricate the second dielectric layer 416, please refer to those materials previously listed in the first embodiment.

Referring to FIG. 4, the through hole capacitor 420 is disposed in the through hole 402 and is connected in parallel with the plate capacitor 410. Furthermore, a metal substrate is adopted in the second embodiment, and therefore a portion of the metal substrate 400 may serve as an anode layer 422 of the through hole capacitor 420. A porous structure 430 is disposed on an inner surface of the through hole 402. A first dielectric layer 424 is disposed on the porous structure 430, as illustrated in a locally enlarged view on the upper right corner of FIG. 4. Positions, materials and choices of structures for a first cathode layer 426 and a second cathode layer 428 may refer to the first embodiment may for all further details and hence are not to be reiterated herein. Moreover, because of the metal substrate 400, a portion thereof connected to the anode does not require a through hole to be fabricated therein. With regard to the through hole for transmitting signals, an insulation layer 444 is required to be disposed between the through hole 402 and a circuit line 440. The through holes 402 in the metal substrate 400 may also be arranged in an array. A shape of the through hole capacitor 420 as that in the first embodiment, besides a circle, may also include other feasible shapes, such as a hexagon, a square or a ring shape. Furthermore, a shape of the plate capacitor 410 in FIG. 4 may include a plain shape, such as a hexagon, a circle or a square. In addition, a portion of the metal substrate 400 may serve as a first conductive layer and an anode layer, or alternatively, a sputtering process may be performed on other conductive materials on the metal substrate 400 to form the first conductive layer or the anode layer.

Figure 5:
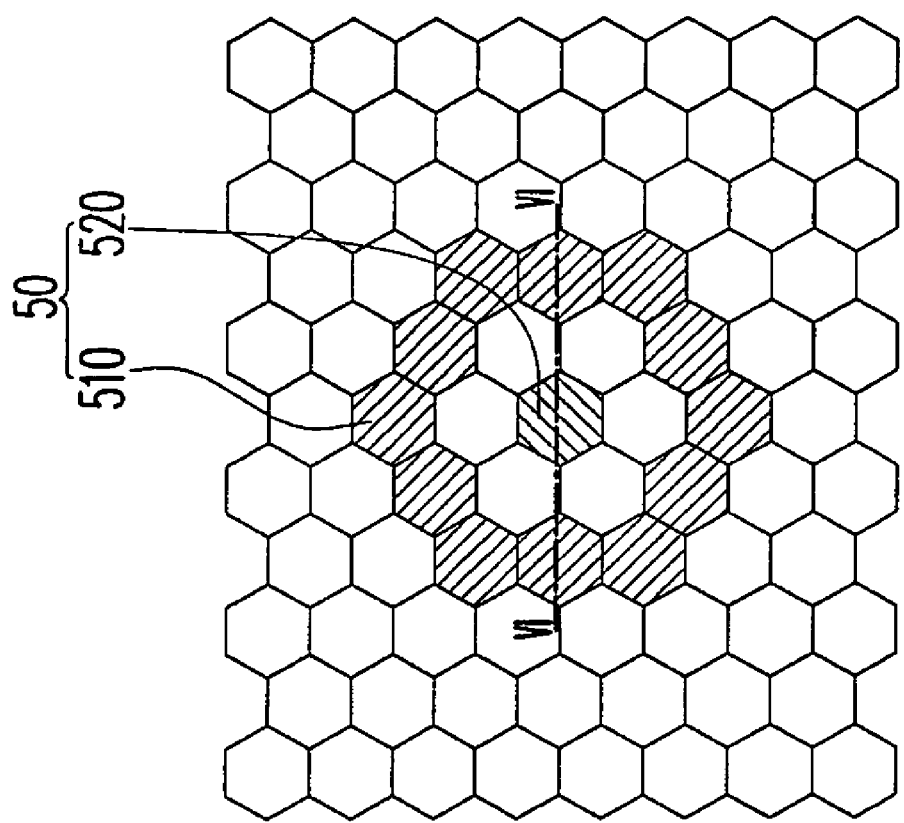
FIG. 5 is a top view of a hybrid capacitor according to the third embodiment of the present invention.
Figure 6:
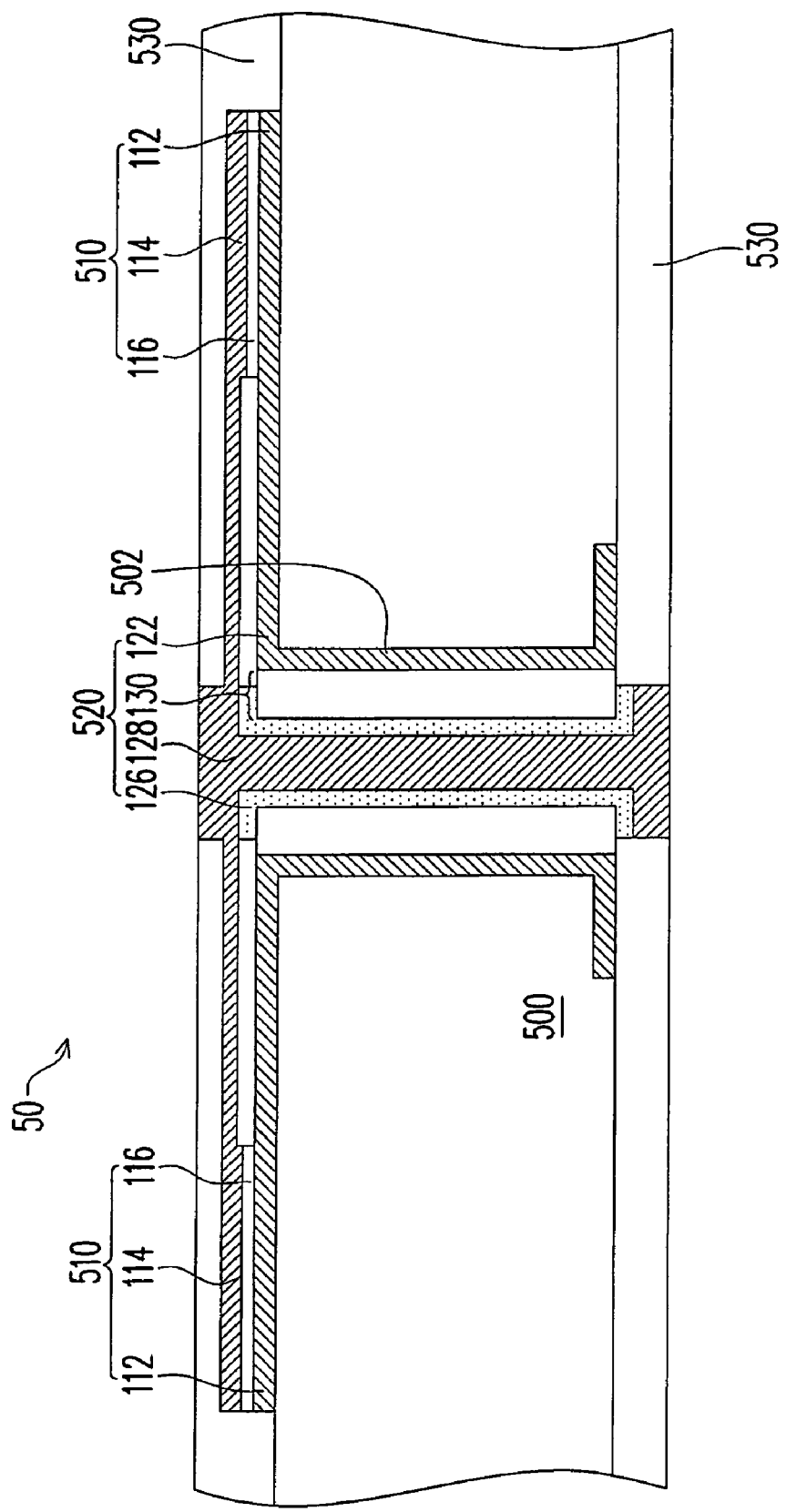
FIG. 6 is a schematic cross-sectional view along line VI-VI of FIG. 5.

FIG. 5 is a top view of a hybrid capacitor according to the third embodiment of the present invention. FIG. 6 is a schematic cross-sectional view along line VI-VI of FIG. 5.

Referring to FIGS. 5 and 6, a hybrid capacitor 50 of the third embodiment includes a substrate 500, at least one plate capacitor 510 and at least one through hole capacitor 520. The substrate 500 has a through hole 502 and the through hole capacitor 520 is disposed in the through hole 502. A structure of the through hole capacitor 520 is identical to that of the through hole capacitor in the first embodiment, and therefore the reference numerals of the first embodiment are adopted herein to represent the same or similar elements. The plate capacitor 510 is disposed on the substrate 500 surrounding the through hole capacitor 520 and connected in parallel therewith. A structure of the plate capacitor 510 is identical to that of the plate capacitor in the first embodiment, and therefore the reference numerals of the first embodiment are adopted herein to represent the same or similar elements. The plate capacitor 510 and the substrate 500 are also covered with an insulation layer 530. According to the third embodiment, the substrate 500 may be a silicon substrate. The substrate 500 may also be a metal substrate, an organic substrate or an insulating substrate. When the substrate 500 is a metal substrate, a portion of the substrate 500 may serve as a first conductive layer of the plate capacitor 510 and another portion of the substrate 500 may serve as an anode layer of the through hole capacitor 520.

Figure 7:
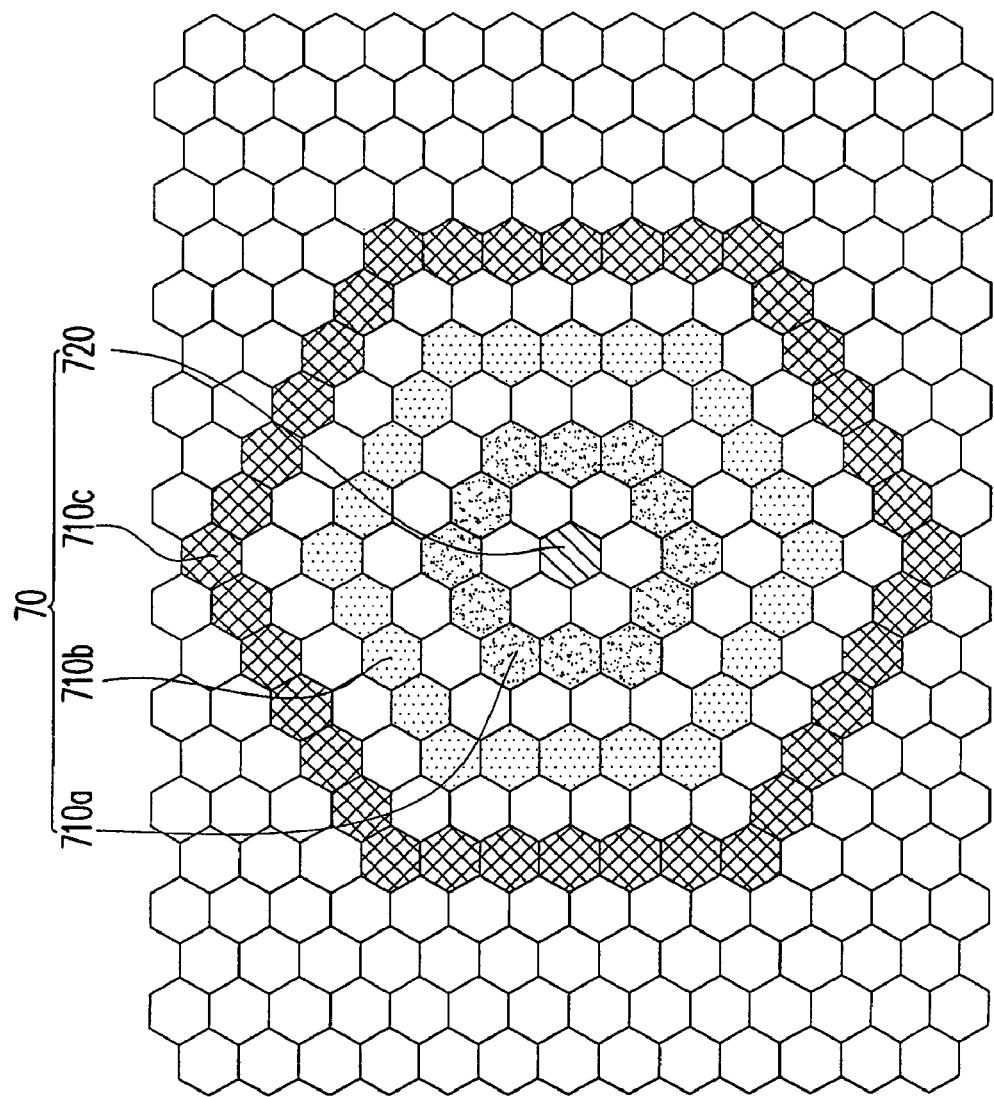
FIG. 7 is a top view of a hybrid capacitor according to a transformed example of FIG. 5.
Figure 8:
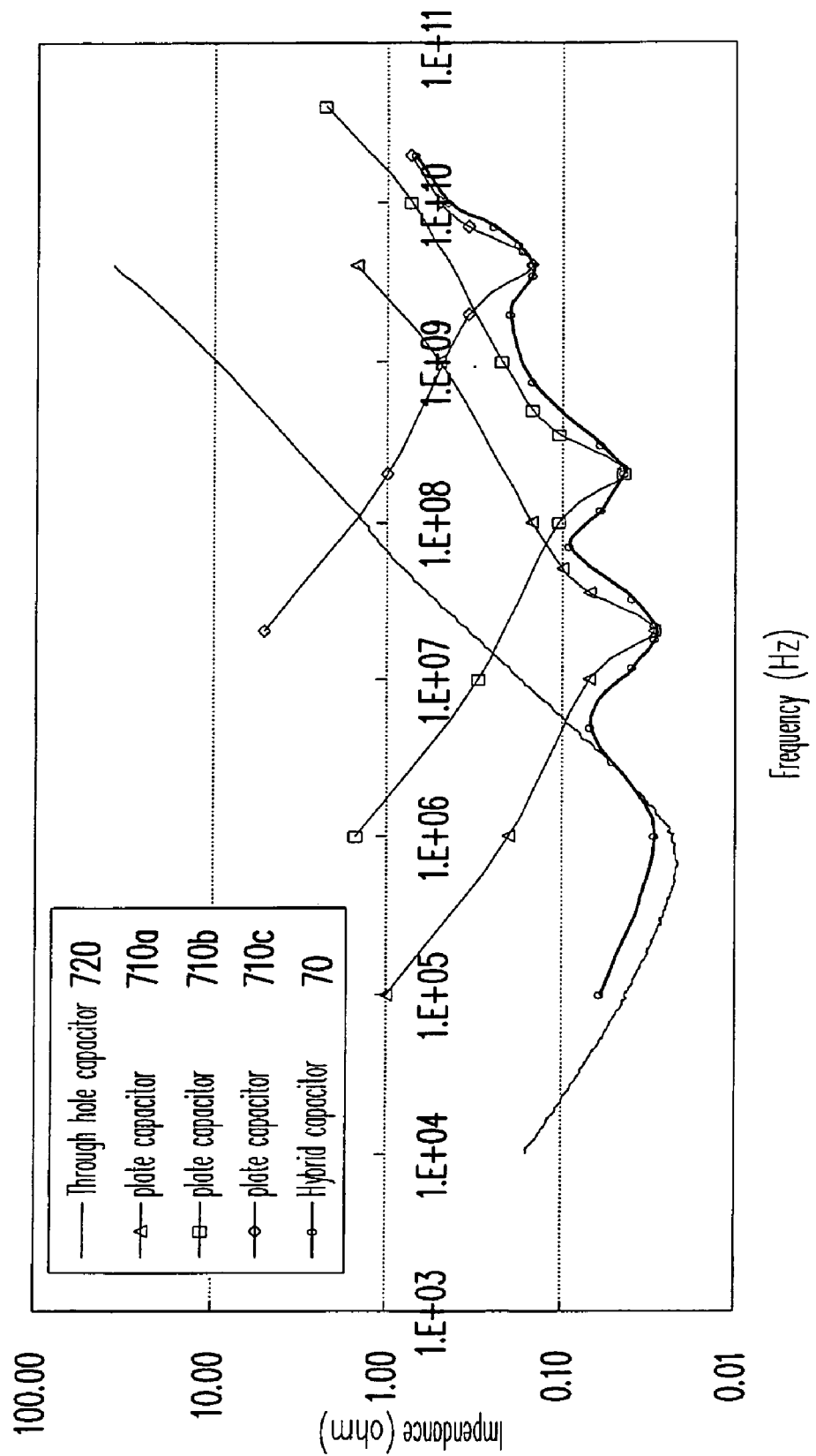
FIG. 8 is a simulated curve diagram between impedance and frequency of the hybrid capacitor of FIG. 7.

Referring again to FIG. 5, the plate capacitor 510 in FIG. 5 and the through hole capacitor 520 are disposed as a hexagon in an array. Thus, a position and a number of the plate capacitor is designed according to an amount of required capacitance, as illustrated in FIG. 7. In FIG. 7, a single through hole capacitor 720 and three circles of plate capacitors 710a, 710b and 710c constitute a hybrid capacitor 70. The plate capacitors 710a, 710b and 710c may adopt capacitors having different dielectric coefficients and thereby obtain a simulated curve diagram between impedance and frequency as illustrated in FIG. 8. It is known from FIG. 8 that the hybrid capacitor of the third embodiment of the present invention is a hybrid capacitor designed to have low impedance within a broadband frequency range to suit actual requirements.

Referring again to FIGS. 6 and 7, when the plate capacitors 710a, 710b and 710c are connected in parallel with the through hole capacitor 720, besides connected in parallel with the substrate 500 on the same side, two sides of the substrate 500 may be disposed with the plate capacitors, or the plate capacitors may be alternately disposed on both sides of the substrate. Additionally, the plate capacitors and the through hole capacitors in the third embodiment may also have other transformations, such as a circular through hole capacitor 900a and a ring-shaped plate capacitor 910a of FIG. 9A, a square through hole capacitor 900b and a square plate capacitor 910b of FIG. 9B, a hexagonal through hole capacitor 900c and a hexagonal ring-shaped plate capacitor 910c of FIG. 9C.

Further, although only one through hole capacitor is illustrated in the hybrid capacitors of the foregoing embodiments, people ordinarily skilled in the art pertinent to the present invention should be able to understand upon reference to the foregoing embodiments that a number of the through hole capacitors may also be increased according to actual requirements so as to form the through hole capacitors in parallel with one another.

In summary, the hybrid capacitor of the present invention is designed to fulfill actual requirements through coordinating the through hole capacitors having the anode layer with the porous structure and the plate capacitors. For example, the hybrid capacitor of the present invention provides a capacitance larger than 0.1 µF within the size of a chip to stabilize voltage among chips and simultaneously remove high-frequency interference of 1-4 GHz. Moreover, the hybrid capacitor is suitable to serve as a silicon interposer substrate capacitor (SISC) and may certainly be disposed on the organic substrate below the IC.

Although the present invention has been disclosed above by preferred embodiments, they are not intended to limit the present invention. Anybody skilled in the art can make some modifications and alterations without departing from the spirit and scope of the present invention. Therefore, the protecting range of the present invention falls in the appended claims.

What is claimed is:

1. A hybrid capacitor, comprising:
    a substrate, the substrate having a plurality of through holes;
    at least one plate capacitor, disposed on the substrate; and
    at least one through hole capacitor, disposed in at least one through hole and connected in parallel with the plate capacitor, the through hole at least comprising:
        an anode layer, at least disposed on an inner surface of the through hole, wherein the anode layer at least on the inner surface of the through hole is a porous structure;
        a first dielectric layer, at least disposed on the porous structure of the anode layer;
        a first cathode layer, covering a surface of the first dielectric layer; and
        a second cathode layer, covering a surface of the first cathode layer, wherein a conductivity of the second cathode layer is larger than a conductivity of the first cathode layer.

2. The hybrid capacitor as claimed in claim 1, wherein the plate capacitor surrounds the through hole capacitor and is connected in parallel therewith.

3. The hybrid capacitor as claimed in claim 1, wherein a material of the anode layer of the through hole capacitor comprises aluminum (Al), tantalum (Ta), niobium (Nb) or niobium oxide (NbO).

4. The hybrid capacitor as claimed in claim 1, wherein the first dielectric layer of the through hole capacitor extends to a surface of the substrate out of the through hole.

5. The hybrid capacitor as claimed in claim 1, wherein a material of the first cathode layer of the through hole capacitor comprises an organic semiconductor, an inorganic semiconductor or an organic-inorganic hybrid conductive material.

6. The hybrid capacitor as claimed in claim 5, wherein the inorganic semiconductor comprises manganese dioxide ($MnO_2$).

7. The hybrid capacitor as claimed in claim 5, wherein the organic semiconductor comprises a charge transfer complex or a conductive polymer.

8. The hybrid capacitor as claimed in claim 7, wherein the conductive polymer comprises polypyrrole, polythiophene or polyaniline.

9. The hybrid capacitor as claimed in claim 7, wherein a material of the first cathode layer comprises a single conductive polymer material or two mixed conductive polymers.

10. The hybrid capacitor as claimed in claim 1, wherein the first cathode layer of the through hole capacitor comprises a multilayer structure.

11. The hybrid capacitor as claimed in claim 1, wherein the second cathode layer of the through hole capacitor comprises a carbon- and metal-containing composite layer.

12. The hybrid capacitor as claimed in claim 11, wherein the metal in the composite layer comprises silver (Ag), copper (Cu), gold (Au) or nickel (Ni).

13. The hybrid capacitor as claimed in claim 1, wherein the second cathode layer of the through hole capacitor comprises a pure metal layer.

14. The hybrid capacitor as claimed in claim 1, wherein the second cathode layer of the through hole capacitor fills up the through hole.

15. The hybrid capacitor as claimed in claim 1, wherein the substrate comprises a silicon substrate, an organic substrate, a metal substrate or an insulating substrate.

16. The hybrid capacitor as claimed in claim 1, wherein the through holes in the substrate are arranged in an array.

17. The hybrid capacitor as claimed in claim 1, wherein the plate capacitor at least comprises:
a first conductive layer;
a second conductive layer, disposed on the first conductive layer; and
a second dielectric layer, disposed between the first conductive layer and the second conductive layer.

18. The hybrid capacitor as claimed in claim 17, wherein a dielectric coefficient of the second dielectric layer in the plate capacitor is about 1-2000.

19. The hybrid capacitor as claimed in claim 17, wherein a thickness of the second dielectric layer in the plate capacitor is about 0.1 µm~10 µm.

20. The hybrid capacitor as claimed in claim 17, wherein a material of the second dielectric layer in the plate capacitor is selected from a group consisted of barium zirconate titanate (BZT); barium strontium titanate (BST); barium titanate; barium titanate containing at least one element of Pb, Nb, W, Ca, Mg and Zn; lead titanate; lead zirconate titanate (PZT); polycrystalline lanthanum-modified lead zirconate titanate (PLZT); lead niobate and deratives thereof; and lead tungstate and deratives thereof.

21. The hybrid capacitor as claimed in claim 17, wherein the first conductive layer and the second conductive layer have a conductive material identical to that of the anode layer.

22. The hybrid capacitor as claimed in claim 17, wherein a metal in the first conductive layer and the second conductive layer is a conductive material identical to a metal of the second cathode layer.

23. The hybrid capacitor as claimed in claim 17, wherein the substrate comprises a metal substrate.

24. The hybrid capacitor as claimed in claim 23, wherein a portion of the metal substrate serves as the first conductive layer of the plate capacitor.

25. The hybrid capacitor as claimed in claim 1, wherein the substrate comprises a metal substrate.

26. The hybrid capacitor as claimed in claim 25, wherein a portion of the metal substrate serves as the anode layer of the through hole capacitor.

27. The hybrid capacitor as claimed in claim 1, wherein a shape of the plate capacitor comprises a hexagon, a circle, a square or a ring shape.

28. The hybrid capacitor as claimed in claim 1, wherein a shape of the through hole capacitor comprises a hexagon, a circle, a square or a ring shape.

* * * * *